(12) United States Patent
Onódy et al.

(10) Patent No.: US 8,903,332 B2
(45) Date of Patent: Dec. 2, 2014

(54) CIRCUIT DEVICE AND METHOD OF COUPLING TO AN ANTENNA

(75) Inventors: Péter Onódy, Budapest (HU); Attila Zolomy, Budapest (HU); Eric Unruh, San Jose, CA (US)

(73) Assignee: Silicon Laboratories Inc., Austin, TX (US)

(*) Notice: Subject to any disclaimer, the term of this patent is extended or adjusted under 35 U.S.C. 154(b) by 886 days.

(21) Appl. No.: 12/489,825

(22) Filed: Jun. 23, 2009

(65) Prior Publication Data

US 2010/0321129 A1 Dec. 23, 2010

(51) Int. Cl.
| | |
|---|---|
| H04B 1/40 | (2006.01) |
| H04M 1/00 | (2006.01) |
| H03H 11/30 | (2006.01) |
| H01P 1/213 | (2006.01) |
| H03F 1/56 | (2006.01) |
| H03H 7/38 | (2006.01) |
| H03F 3/195 | (2006.01) |
| H03F 1/52 | (2006.01) |

(52) U.S. Cl.
CPC .............. *H01P 1/213* (2013.01); *H03H 11/30* (2013.01); *H03F 2200/387* (2013.01); *H03F 2200/222* (2013.01); *H03F 2200/294* (2013.01); *H03F 1/56* (2013.01); *H03H 7/38* (2013.01); *H03F 3/195* (2013.01); *H03F 1/52* (2013.01)
USPC .......................................... 455/77; 455/550.1

(58) Field of Classification Search
CPC ................... H04B 2203/5425; H04L 25/0278; H03H 7/38
USPC ........ 455/73, 75, 77, 82, 83, 550.1, 120, 121, 455/193.1, 284, 305, 333
See application file for complete search history.

(56) References Cited

U.S. PATENT DOCUMENTS

| | | | |
|---|---|---|---|
| 3,821,655 A | 6/1974 | Fisher | |
| 4,637,073 A | 1/1987 | Selin et al. | |
| 5,285,177 A | 2/1994 | Norose | |
| 5,477,532 A | 12/1995 | Hoshigami et al. | |
| 5,521,561 A | 5/1996 | Yrjola et al. | |
| 5,784,687 A | 7/1998 | Itoh et al. | |
| 6,009,314 A | 12/1999 | Bjork et al. | |
| 6,026,280 A | 2/2000 | Yokomura | |
| 6,498,535 B1 | 12/2002 | Allen et al. | |
| 6,504,433 B1 | 1/2003 | Weber et al. | |
| 6,529,075 B2 | 3/2003 | Bruck et al. | |
| 6,658,265 B1 | 12/2003 | Steel et al. | |
| 6,735,418 B1 | 5/2004 | MacNally et al. | |
| 6,919,858 B2 | 7/2005 | Rofougaran | |
| 7,034,630 B2 | 4/2006 | Rijks | |
| 7,899,409 B2 * | 3/2011 | Huang et al. | 455/78 |

(Continued)

*Primary Examiner* — Andrew Wendell
(74) *Attorney, Agent, or Firm* — Cesari & Reed LLP; R. Michael Reed

(57) ABSTRACT

In an embodiment, a circuit device for coupling to an antenna includes a first impedance matching circuit configured to couple to the antenna and a second impedance matching circuit configured to couple to the antenna. The circuit device further includes a power amplifier coupled to the first impedance matching circuit and includes a low-noise amplifier coupled to the second impedance matching circuit. Additionally, the circuit device includes a selectable impedance adjustment circuit coupled between the low-noise amplifier and the second impedance matching circuit, which selectable impedance adjustment circuit is configured to selectively adjust an impedance associated with the low-noise amplifier when the power amplifier is transmitting a signal through the antenna.

19 Claims, 6 Drawing Sheets

(56) References Cited

U.S. PATENT DOCUMENTS

| | | |
|---|---|---|
| 7,986,924 B2 * | 7/2011 | Kim et al. .................. 455/107 |
| 8,000,737 B2 * | 8/2011 | Caimi et al. .............. 455/550.1 |
| 2002/0101907 A1 * | 8/2002 | Dent et al. .................. 375/132 |
| 2004/0113654 A1 * | 6/2004 | Lundberg .................... 326/30 |
| 2005/0134385 A1 * | 6/2005 | Costa et al. .................. 330/283 |
| 2006/0049893 A1 * | 3/2006 | Ozasa et al. ................. 333/124 |
| 2006/0089116 A1 * | 4/2006 | Yamazaki ................. 455/193.1 |
| 2007/0207746 A1 | 9/2007 | Huang et al. |
| 2008/0020717 A1 | 1/2008 | Marholev et al. |
| 2008/0174383 A1 | 7/2008 | Zolomy et al. |
| 2012/0293268 A1 * | 11/2012 | Laurila ........................ 330/302 |

* cited by examiner

CIRCUIT DEVICE AND METHOD OF COUPLING TO AN ANTENNA

BACKGROUND

The present disclosure relates generally to a radio frequency circuit device and method of controlling impedance, and more particularly to a low-power, low-cost radio frequency circuit device including a power amplifier and a low-noise amplifier coupled to an antenna without an intervening transmit/receive switch.

In many instances, radio frequency transceiver circuitry includes an low noise amplifier circuit for clear reception of a radio signal transmitted to the receiver and received through an antenna and includes a power amplifier circuit for transmitting a radio signal through the antenna to another device. Typically, power amplifier and low noise amplifier circuits are selectively coupled to the antenna through a transmit/receive (antenna) switch. Unfortunately, the cost of the antenna switch may be prohibitive for low-cost applications.

In radio frequency transceiver circuitry, impedance mismatches between transmission lines and circuit components will cause power losses due to signal reflections, resulting in degradation of transmission signal strength and signal-to-noise ratio. In an example, for desired performance and power, a power amplifier's output impedance can be matched to impedance associated with the transmission line extending from the power amplifier to the antenna. Similarly, for desired low-noise operation, the input impedance of low noise amplifier can be matched to impedance of transmission lines leading from the antenna to the low noise amplifier.

When the antenna switch is used to switch between transmit and receive modes, power amplifier and low noise amplifier can include their own impedance matching circuitry designed specifically for the transmit or receive modes. However, if the antenna switch were omitted, such mode-specific impedance matching would introduce impedance mismatches, degrading transmission power and decreasing the signal-to-noise ratio. Further, high peak voltages of the power amplifier in transmission mode could destroy a high performance low noise amplifier, which is typically not designed to handle such high voltage levels.

Accordingly, embodiments of a transceiver circuit are disclosed below that provide a new structure and technique for coupling a power amplifier and a differential input low noise amplifier to an antenna.

SUMMARY

In an embodiment, a circuit device for coupling to an antenna includes a first impedance matching circuit configured to couple to the antenna and a second impedance matching circuit configured to couple to the antenna. The circuit device further includes a power amplifier coupled to the first impedance matching circuit and includes a low-noise amplifier coupled to the second impedance matching circuit. Additionally, the circuit device includes a selectable impedance adjustment circuit coupled between the low-noise amplifier and the second impedance matching circuit, which selectable impedance adjustment circuit is configured to selectively adjust an impedance associated with the low-noise amplifier when the power amplifier is transmitting a signal through the antenna.

In another embodiment, a method is disclosed that includes transmitting a signal from a power amplifier through a first impedance matching circuit to an antenna. The method further includes selectively coupling differential inputs of a low-noise amplifier to each other and to a power supply terminal to adjust an impedance of the low-noise amplifier to present high impedance through a second impedance matching circuit when the power amplifier is transmitting the signal. The second impedance matching circuit couples the differential inputs of the low-noise amplifier to the antenna. Further, the method further includes selectively decoupling the differential inputs of the low-noise amplifier from each other and from the power supply terminal to adjust the impedance of the low-noise amplifier to present low impedance when the antenna is receiving a signal.

DETAILED DESCRIPTION

The following detailed description refers to the accompanying drawings that depict various details of examples selected to show how particular embodiments may be implemented. The discussion herein addresses various examples of the inventive subject matter at least partially in reference to these drawings and describes the depicted embodiments in sufficient detail to enable those skilled in the art to practice the invention. Many other embodiments may be utilized for practicing the inventive subject matter than the illustrative examples discussed herein, and many structural and operational changes in addition to the alternatives specifically discussed herein may be made without departing from the scope of the inventive subject matter.

In this description, references to "one embodiment" or "an embodiment," or to "one example" or "an example" mean that the feature being referred to is, or may be, included in at least one embodiment or example of the invention. Separate references to "an embodiment" or "one embodiment" or to "one example" or "an example" in this description are not intended to necessarily refer to the same embodiment or example; however, neither are such embodiments mutually exclusive, unless so stated or as will be readily apparent to those of ordinary skill in the art having the benefit of this disclosure. Thus, the present invention can include a variety of combinations and/or integrations of the embodiments and examples described herein, as well as further embodiments and examples as defined within the scope of all claims based on this disclosure, as well as all legal equivalents of such claims.

Figure 1:
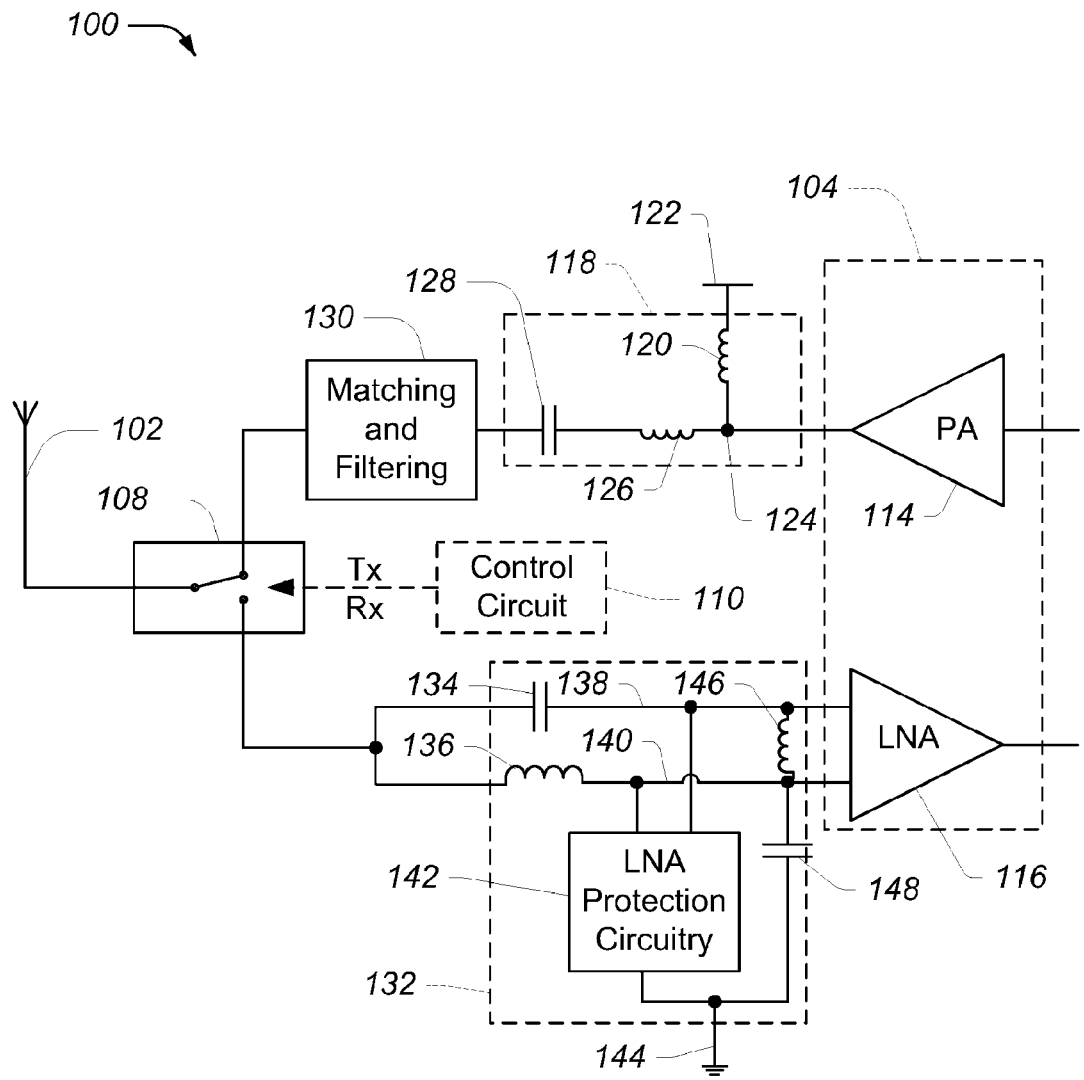
FIG. 1 depicts a conventional radio frequency circuit device including transceiver circuitry with a power amplifier and a low-noise amplifier coupled to an antenna through a transmit/receive (antenna) switch.

FIG. 1 depicts conventional RF circuit device 100 including transceiver circuitry 104 having power amplifier (PA) 114 and low-noise amplifier (LNA) 116 coupled to antenna 102 through transmit/receive (TX/RX) antenna switch 108. Antenna switch 108 is responsive to control signals (such as TX and RX control signals) from control circuit 110 to selectively couple PA 114 to antenna 102 in a transmit mode and to selectively couple LNA 116 to antenna 102 in a receive mode. In an example, control circuit 110 can include a microcontroller, a processor, control logic, and/or other control circuitry.

PA 114 is coupled to antenna switch 108 through first impedance matching circuit 118. First impedance matching circuit 118 includes inductor 120 coupled between power supply terminal 122 and PA output node 124. First impedance matching circuit 118 further includes inductor 126 and capacitor 128 coupled in series between node 124 and matching and filtering circuit 130, which is coupled to antenna switch 108. PA 114 in conjunction with impedance matching circuit 118 can introduce high harmonic content to signals provided to antenna 102 through switch 108, and thus matching and filtering circuit 130 provides for filtering of the harmonics, and (if necessary) an impedance transformation before providing the signal to antenna 102. In RF circuit 100, capacitance and inductance values of capacitor 128 and inductors 120 and 126 can be selected to provide an impedance value related to impedance of antenna 102 to provide a desired output power.

LNA 116 is coupled to antenna switch 108 through second impedance matching circuit 132. The second impedance matching circuit 132 includes capacitor 134 and inductor 136 coupled between antenna switch 108 and the LNA's first and second (differential) inputs 138 and 140, respectively, and includes inductor 146 coupled between inputs 138 and 140 and capacitor 148 coupled between input 140 and electrical ground terminal 140. In some configurations, depicted inductor 146 can represent parasitic inductance between inputs 138 and 140, and depicted capacitor 148 can represent a parasitic capacitance associated with LNA 116.

Second impedance matching circuit 132 is configured to convert a single-ended signal from antenna 102 into a balanced differential signal suitable for input to the LNA 116. In some examples, second impedance matching circuit 132 will have the same functionality as an ideal Balun circuit over a narrow frequency band. As used herein, the term "Balun" refers to a circuit device that converts between single-input, unbalanced signals to balanced differential signals. At a desired operating frequency (such as a reception frequency), capacitor 134 and inductor 136 are configured to provide balanced differential inputs to LNA 116, the inputs having the same amplitude but with one input phase shifted by one hundred eighty (180) degrees relative to the other input. Additionally, capacitor 134 and inductor 136 cooperate to match an impedance value associated with antenna 102, which may have, for example, an impedance value of approximately 50 Ohms within a frequency band associated with the receiving mode.

Values of components within first and second impedance matching circuits 118 and 132 are selected based on a desired operating frequency of the transmitted and received signals, respectively. The values of first impedance matching circuit 118 are preferably selected to match an input impedance of antenna 102 as seen from a perspective of PA 114. The values of second impedance matching circuit 118 are preferably selected to match an input impedance of LNA 116 from a perspective of antenna 102.

To provide high receiver performance, LNA 116 is formed from high speed transistors, which can have a limited maximum signal voltage level, necessitating a protection circuit, such as LNA protection circuitry 142, which is coupled between the differential inputs of LNA 116 and a power supply terminal, such as electrical ground terminal 140. In some instances, protection circuitry 142 includes diodes, which may be arranged in anti-parallel pairs to provide electrostatic discharge (ESD) protection for LNA 116. As used herein, the term "anti-parallel pair" refers to a pair of diodes coupled in parallel opposite to one another between two nodes such that the anode terminal of one diode is coupled to the cathode terminal of the other diode, and vice versa.

Controller 110 selectively activates antenna switch 108 to couple PA 114 and first impedance matching circuit 118 to antenna 102 during a transmit mode and to couple LNA 116 and second impedance matching circuit 132 to antenna 102 during a receive mode. As mentioned earlier herein, antenna switch 108 can be cost prohibitive for inclusion within a low-cost, low-power circuit device.

Accordingly, in accordance with the present invention, a circuit device is disclosed below that includes an impedance matching circuit coupled to an antenna, a power amplifier (PA) coupled to the antenna through the impedance matching circuit, and a low-noise amplifier (LNA) coupled to the antenna through the impedance matching circuit without a TX/RX antenna switch. Further, the circuit device includes a selectable impedance adjustment circuit coupled between the LNA and the impedance matching circuit and configured to selectively adjust an impedance associated with the LNA when the PA is transmitting a signal through the antenna.

Figure 2:
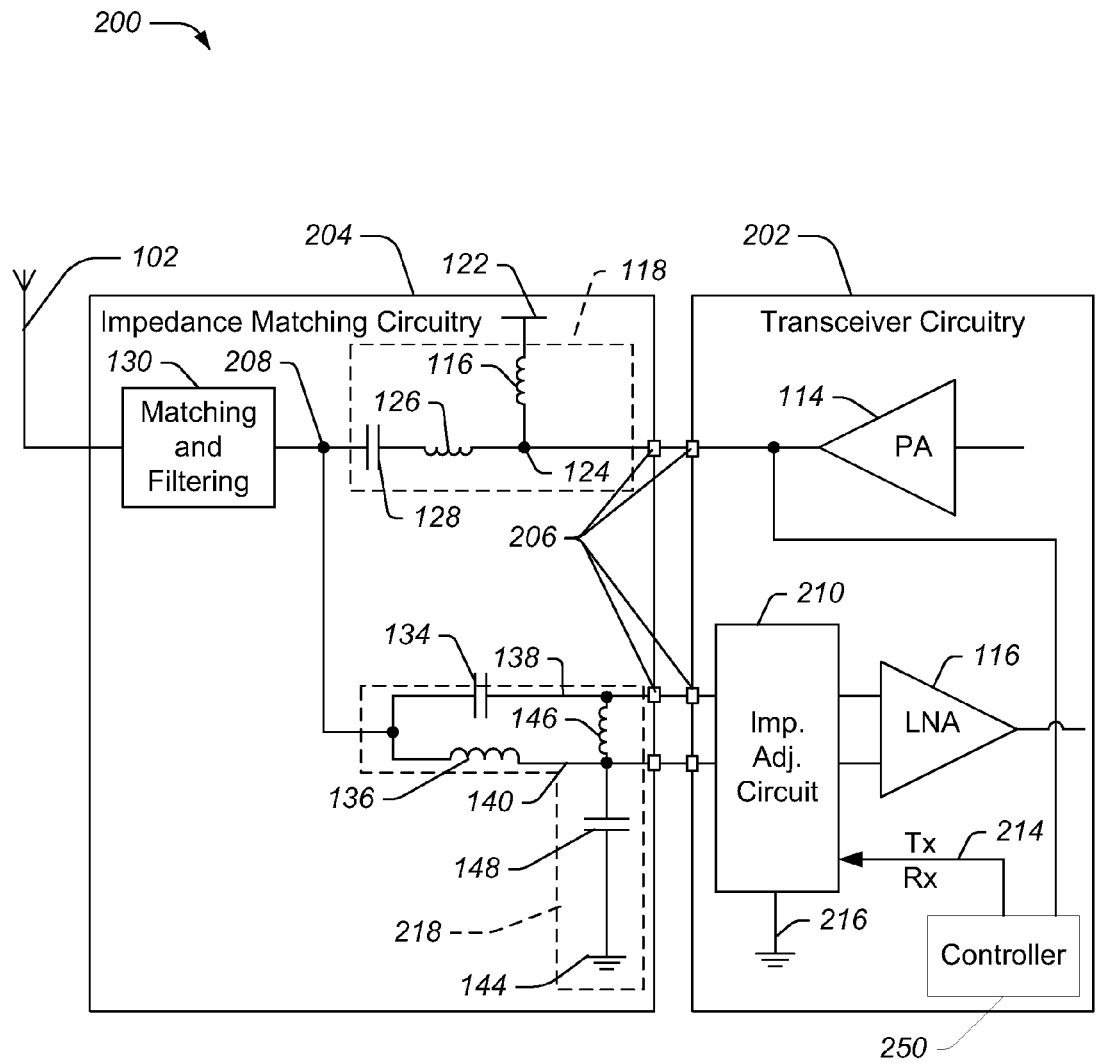
FIG. 2 depicts an example of a radio frequency circuit device including transceiver circuitry with a power amplifier and a low-noise amplifier coupled to an antenna without an intervening antenna switch and including selectable impedance adjustment circuitry.

FIG. 2 depicts an example of an RF circuit device 200, in accordance with the present invention, including transceiver circuitry 202 with PA and LNA 114 and 116 coupled to antenna 102 without an intervening antenna switch and including selectable impedance adjustment circuitry 210. Elements identical to those discussed in reference to the conventional RF circuit device 100 have been numbered similarly.

Transceiver circuit 202 is coupled to antenna 102 through impedance matching circuitry 204. Impedance matching circuitry 204 includes first impedance matching circuit 118 to couple PA 114 to node 208, which is coupled to antenna 102 through matching and filtering circuit 130. In contrast to RF circuit 100 depicted in FIG. 1 where matching and filtering circuit 130 was between PA 114 and antenna 102 but not between LNA 116 and antenna 102, in impedance matching circuitry 204, filtering and matching circuit 130 is between antenna 102 and node 208 (i.e. in both transmit and receive paths). Node 208 represents a "switch-less" connection between impedance matching networks 118 and 218 and antenna 102.

LNA 116 is coupled to node 208 through impedance matching circuit 218 and through impedance adjustment circuit 210. Impedance matching circuit 218 is generally the same as impedance matching circuit 132, depicted in FIG. 1, except that LNA protection circuitry 142 is omitted from impedance matching circuit 218 and, in some instances, is included within impedance adjustment circuit 210. However, in this instance, the capacitance and the inductance of capacitor 134 and inductor 136 are selected to match a resonance frequency corresponding to the transmission frequency of PA 114.

Impedance adjustment circuit 210 is responsive to TX/RX control signal 214 from control circuit or controller 250. Controller 250 includes a processor or logic circuitry configured to control impedance adjustment circuit 210 based on an operating mode. As depicted, controller 250 detects a signal at an output of PA 114, and when the signal exceeds a threshold, activates impedance adjustment circuit 210. As mentioned previously herein, signals generated by PA 114 during transmit mode may be sufficiently high to damage LNA 116. Accordingly, control circuit 250 is configured to prevent such transmitted signals from reaching the inputs of LNA 116. In an alternative embodiment, controller 250 may receive instructions from an external control circuit or microprocessor, for example. In another alternative embodiment, controller 250 may be part of, for example, another circuit that is adapted to communicate with impedance adjustment circuit 210. In some instances, controller 250 is configured to control the operating mode and generates the TX/RX control signal 214 as part of that control process, activating the impedance adjustment circuit 210 when switching to a transmit mode. In such an instance, controller 250 may activate impedance adjustment circuit 210 by default during transmit mode and may deactivate impedance adjustment circuit 210 during receive mode.

In response to an RX control signal 214, impedance adjustment circuit 210 will be inactive, presenting relatively low impedance to signals received from node 208. In a receive mode, a received signal from antenna 102 passes through matching and filtering circuit 130, which is lossy and which also, in some embodiments, performs an impedance transformation. This impedance transformation did not occur in the conventional RF circuit device 100 depicted in FIG. 1, because matching and filtering circuit 130 was not in the receive path. Such impedance transformation can be eliminated or compensated by adjusting capacitance and inductance values of impedance matching network 218.

In response to a TX control signal 214, impedance adjustment circuit 210 will be activated to selectively short differential inputs 138 and 140 to electrical ground terminal 216, placing capacitor 134 and inductor 136 in parallel between node 208 and electrical ground terminal 216. The capacitance value associated with capacitor 134 and the inductance value associated with inductor 136 present a high impedance value to the node 208 when impedance adjustment circuit 210 shorts differential inputs 138 and 140 to electrical ground terminal 216. Further, by activating impedance adjustment circuit 210 in response to control signal 214, a low impedance path from differential inputs 138 and 140 to electrical ground terminal 144 is provided, protecting LNA 116 from high signal voltages of the operating PA 114.

The high impedance provided by activating impedance adjustment circuit 210 results in very low loss of output power in a transmit mode (less than 1 dB loss, compared to the case when LNA 116 is not connected, such as by activation of antenna switch 108 in FIG. 1). Further, impedance adjustment circuit 210 is configured to clamp voltage levels across differential inputs 138 and 140 at low voltages during transmissions by PA 114, such as at voltage levels at or below approximately 100 mV.

The resonant peak (Q) of the parallel resonance (L-C) circuit is primarily defined by an on-state impedance of the impedance adjustment circuit 210, with a lower on-state impedance value resulting in a higher resonant peak (Q) value. Higher resonant peak (Q) values present greater impedances to PA 114, resulting in less degradation of output power in a transmission mode. However, a higher resonant peak (Q) value also narrows the operational frequency range of the circuit, so the on-state impedance of the impedance adjustment circuit 210 can be chosen accordingly.

While the above-example depicts transceiver circuit 202 and impedance matching circuitry 204 as separate circuits, in an alternative embodiment, impedance matching circuitry 204 may be combined with transceiver circuit 202 and the resulting circuit can be coupled to antenna 102.

Figure 3:
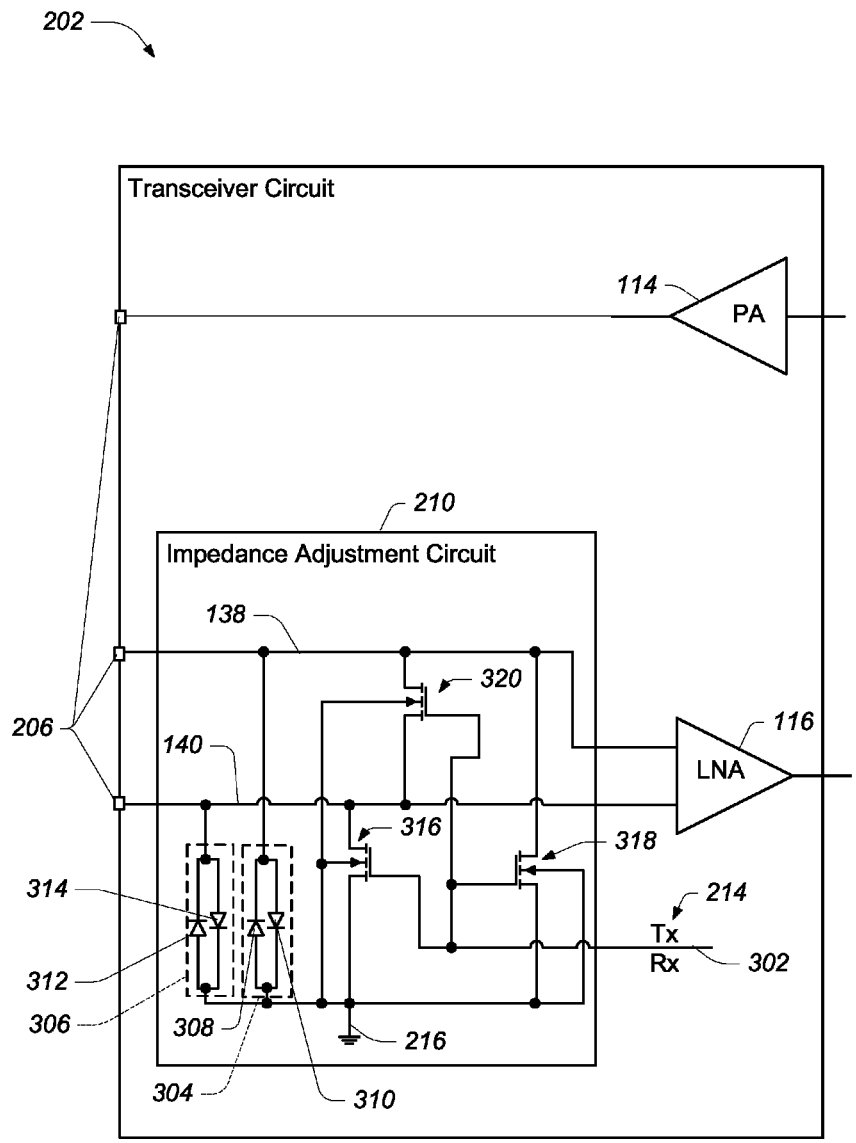
FIG. 3 depicts an example of transceiver circuitry of FIG. 2 including selectable impedance adjustment circuitry.

FIG. 3 depicts an example of transceiver circuitry 202 of FIG. 2 including impedance adjustment circuit 210, which is selectable by TX/RX control signals 214 received from a controller via control line 302. Impedance adjustment circuit 210 includes first and second anti-parallel diode pairs 304 and 306 to provide over-voltage and electrostatic discharge (ESD) event protection for LNA 116. In particular, first anti-parallel diode pair 304 includes diode 308 having an anode terminal coupled to electrical ground terminal 216 and a cathode terminal coupled to first input 138 and includes diode 310 having an anode terminal coupled to first input 138 and cathode terminal coupled to electrical ground terminal 216. Second anti-parallel diode pair 306 includes diode 312 having an anode terminal coupled to electrical ground terminal 216 and a cathode terminal coupled to second input 140 and includes diode 314 having an anode terminal coupled to second input 140 and cathode terminal coupled to electrical ground terminal 216.

Impedance adjustment circuit 210 also includes a plurality of transistors, such as metal oxide semiconductor field effect transistor (MOSFET) devices, including transistors 316 and 318. Transistor 316 includes a drain terminal coupled to second input 140, a source terminal coupled to electrical ground terminal 216, and a gate terminal coupled to control line 302 to receive TX/RX control signal 214. As previously mentioned, the TX/RX control signal 214 is received from controller 250. Transistor 318 includes a drain terminal coupled to first input 138, a source terminal coupled to electrical ground terminal 216, and a gate terminal coupled to control line 302 to receive TX/RX control signal 214. When activated, transistors 316 and 318 provide a current path from differential inputs 138 and 140 to electrical ground terminal 216.

In some instances, impedance adjustment circuit 210 also includes transistor 320, which has drain and source terminals coupled to the first and second inputs 138 and 140 and which has a gate terminal coupled to control line 302 to receive TX/RX control signal 214. When activated by the TX/RX control signal 214, transistor 320 ties differential inputs 138 and 140 together, reducing a parasitic capacitance associated with the impedance adjustment circuit 210 without altering the resonant peak (Q) value, thereby improving performance of the circuit.

In the depicted example, an advantage of introducing the third transistor 320 is that a high current within the parallel resonant circuit flows between capacitor 134 and inductor 136 (of impedance matching circuit 218 depicted in FIG. 2), through transistor 320 and not necessarily to electrical ground terminal 216. In this instance, the on-state resistance of transistors 316 and 318 can be as much as ten times greater than the on-state resistance of the transistor 320. In a particular example, without transistor 320, a size of transistors 316 and 318 would be as much as four times larger to achieve the same resonant peak (Q) value than if transistor 320 is present.

LNA 116 has a higher input impedance value when it is turned off than it does when it is turned on, in part, because the resistive part of the on-state input impedance of LNA 116 is provided by active feedback. In an off-state (such as when power is turned off to LNA 116), the feedback is not present so the resistive part of the impedance of LNA 116 can be very high. Even a low power (low voltage) signal at impedance matching circuit 218 can result in high voltage levels across differential inputs 138 and 140. However, impedance adjustment circuit 210, and particularly transistors 316, 318 and 320, cooperate to shunt the input impedance, eliminating the high voltage effects (i.e., clamping an input voltage) across the differential inputs 138 and 140. In some instances, the voltage is clamped to approximately an electrical ground voltage level. In another example, the voltage is clamped to a level that is at or below approximately 100 mV.

Figure 4A:
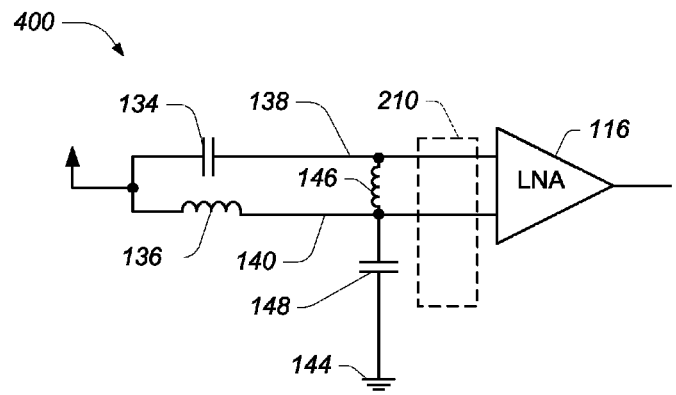
FIGS. 4A and 4B depict schematic diagrams of low-noise amplifier and associated portions of impedance matching circuit of FIG. 2, including selectable impedance adjustment circuitry, in receive and transmit modes of operation, respectively.
Figure 4B:
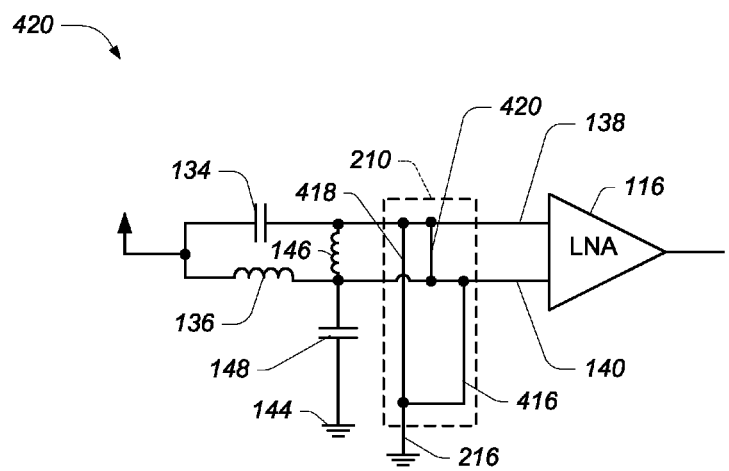

FIGS. 4A and 4B depict schematic diagrams 400 and 420 of LNA 116, associated portions of impedance matching circuit 218 of FIG. 2, and selectable impedance adjustment circuit 210 in receive and transmit modes of operation, respectively. In the receive mode, the impedance adjustment circuit 210 is inactive, and the switching circuitry (transistors 316, 318, and 320) are open circuits that may contribute slightly to the parasitic inductance and capacitance represented by the inductor 146 and the capacitor 148.

Referring to FIG. 4B, schematic diagram 420 illustrates that, in a transmit mode, impedance adjustment circuit 210 is activated to provide current paths 416, 418, and 420 (corresponding to transistors 316, 318, and 320 depicted in FIG. 3) between first and second inputs 138 and 140 and an electrical ground terminal 216. In this example, connections 416, 418 and 420 indicate short circuits that bypass inductor 146 and capacitor 148, altering an impedance of LNA 116 (from the perspective of node 208, depicted in FIG. 2).

Figure 5A:
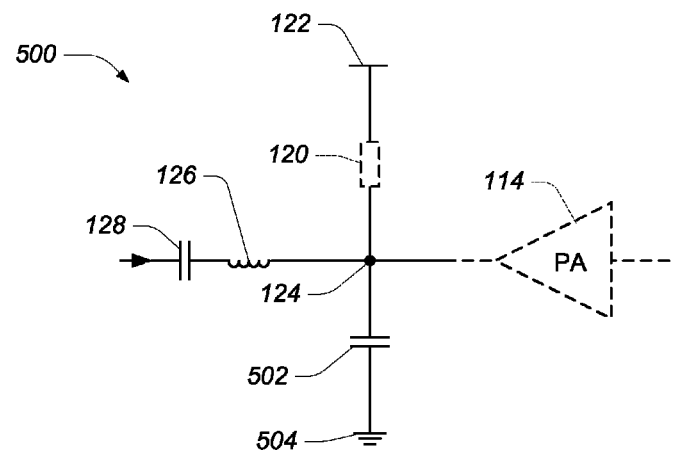
FIGS. 5A and 5B depict schematic diagrams of an example of power amplifier and associated portions of impedance matching circuit of FIG. 2, in receive and transmit modes, respectively.
Figure 5B:
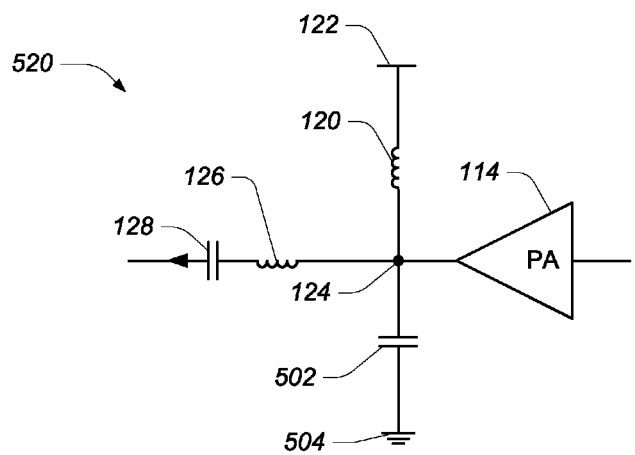

FIGS. 5A and 5B depict schematic diagrams 500 and 520 of an example of PA 114 and associated portions of impedance matching circuit 118 of FIG. 2, in receive and transmit modes, respectively. In receive mode, inductors 120 and 126 and capacitor 128 can load the incoming signal, especially if the respective inductance and capacitor values are selected solely for transmission mode operation. However, by choosing an inductance associated with inductor 120 to be sufficiently high to provide constant current during transmission mode, in receive mode, inductor 120 will be high impedance, and can be modeled as an open circuit. Further, in receive mode, PA 114 can be turned off and can be modeled as a high resonant peak (Q) capacitance, such as that depicted by the capacitor 502 between node 124 and electrical ground terminal 504 (which may be coupled to electrical ground terminal 216 depicted in FIG. 2). In this example, inductor 126 and capacitor 128 are chosen for a class-E design to have a resonance frequency that is slightly lower than a transmission operating frequency. Accordingly, total capacitance of the circuit depicted in the diagram 500, in a receive mode, is represented by the following equation:

$$C_{Total} = \frac{1}{\left(\frac{1}{C_{128}} + \frac{1}{C_{502}}\right)} \qquad \text{(Equation 1)}$$

Total capacitance ($C_{Total}$) is lower than the capacitance associated with capacitor 128. The resulting total capacitance ($C_{Total}$) forms a resonance network with inductor 126. The series resonant frequency of the total capacitance ($C_{Total}$) and the inductance of inductor 126, where the impedance is low, can fall very close to the receive frequency. To prevent impedance adjustment circuit 210 associated with LNA 116 from shunting differential inputs 138 and 140 and thereby degrading the sensitivity of the transceiver in the receive mode, inductor 126 is chosen to achieve a parallel resonance with the capacitance of PA 114, represented by capacitor 502, at the receive frequency (or within the range of the receive frequency), thereby providing high impedance in the receive mode. Such high impedance prevents the received signal from being shunted by impedance adjustment circuit 210, resulting in minimal loss of sensitivity during reception.

In a transmit mode as depicted in FIG. 5B, inductor 116 provides a constant current to node 124. Further, in transmit mode, the resonance frequency of impedance matching circuit 118 is slightly lower than a transmit frequency. In an example, inductance and capacitance values of inductor 126 and capacitor 128 can be selected for desired power performance in transmit mode. With a lower inductance value for inductor 126, radio frequency current fluctuations may appear across inductor 126, so careful selection of the inductance value is preferred.

Figure 6:
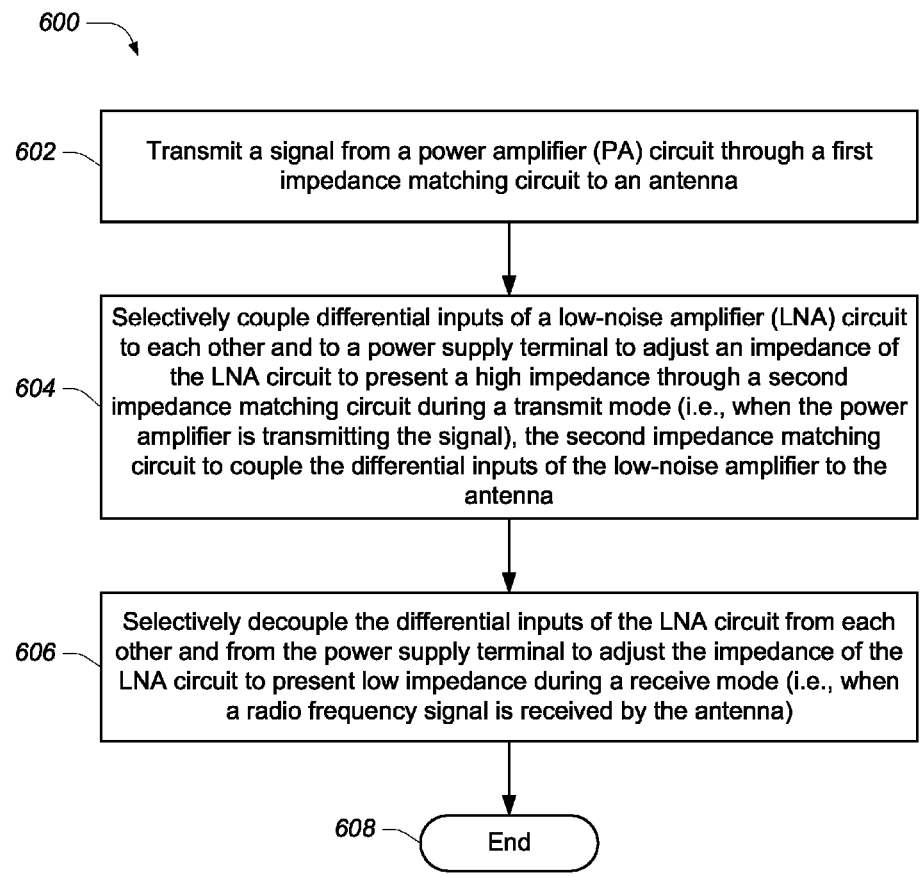
FIG. 6 depicts a flow diagram of an example of a method of sending and receiving data through an antenna using the circuit device of FIG. 2, including selectable impedance adjustment circuitry.

FIG. 6 depicts a flow diagram 600 of an example of a method of sending and receiving data through an antenna using the circuit device of FIG. 2, including selectable impedance adjustment circuitry. At 602, a signal is transmitted from a PA through a first impedance matching circuit to an antenna. Advancing to 604, differential inputs of a low-noise amplifier (LNA) circuit are selectively coupled to each other and to a power supply terminal to adjust an impedance of the LNA to present high impedance through a second impedance matching circuit during a transmit mode (i.e., when the PA is transmitting the signal), where the second impedance matching circuit couples the differential inputs of the LNA to the antenna. In an example, selectively coupling the differential inputs includes activating a first transistor to couple the differential inputs to each other, activating a second transistor to couple a first differential input a power supply terminal (such as electrical ground terminal 216 in FIG. 2), and activating a third transistor to couple a second differential input to the power supply terminal. In one example, activating the first transistor includes placing a capacitor and an inductor of the second impedance matching network in parallel between the antenna and the power supply terminal, which presents high impedance to signals transmitted by the power amplifier.

Moving to 606, the differential inputs of the LNA are selectively decoupled from each other and from the power supply terminal to adjust the impedance of the LNA to present low impedance during a receive mode (i.e., when the antenna is receiving a radio frequency signal). In an example, decoupling the differential inputs includes deactivating transistors, such as transistors 316, 318, and 320 depicted in FIG. 3. Decoupling the differential inputs lowers input impedance associated with the LNA. The method terminates at 608.

In an example, the method further includes protecting the LNA against high voltage signals (such as electrostatic discharge events and other high voltage events that might otherwise damage LNA circuitry) on the differential inputs using a first anti-parallel diode pair coupled between a first differential input and the power supply terminal and using a second anti-parallel diode pair coupled between a second differential input and the power supply terminal.

It should be understood that the method depicted in FIG. 6 and described above is provided for illustrative purposes only, and is not intended to be limiting. Further, blocks depicted in FIG. 6 may be rearranged, omitted, or replaced. For example, block 602 may be replaced by a block indicating that a signal is received, and blocks 604 and 606 may be interchanged appropriately. Further, in an example, the method may include alternating between sending and receiving signals, such that blocks 604 and 606 alternate as needed.

In conjunction with circuits and methods disclosed above with respect to FIGS. 2-6, a circuit device is disclosed that includes PA circuitry and LNA circuitry coupled to an antenna without an intervening TX/RX (antenna) switch. The circuit device includes an impedance adjustment circuit that is selectively activated by a control signal to control an impedance value associated with LNA circuitry, increasing impedance during transmission and decreasing impedance during reception. In an embodiment, an inductance value associated with an inductor at an output of PA circuitry is selected to provide a parallel resonance with a parasitic capacitance associated with the PA circuit. In another embodiment, impedance adjustment circuitry includes two or more switches to selectively couple differential inputs of LNA circuitry to an electrical ground terminal and/or to each other, to alter an impedance value associated with circuitry of a matching network.

Many additional modifications and variations may be made in the techniques and structures described and illustrated herein without departing from the spirit and scope of the present invention. For example, In FIG. 3, transistor 320 can be omitted. In another embodiment, transistor 316 may be omitted, such that differential inputs 138 and 140 are coupled to each other through transistor 320 and to electrical ground terminal 216 through transistor 318. Accordingly, the present invention should be clearly understood to be limited only by the scope of the claims and the equivalents thereof.

We claim:

1. A circuit device for coupling to an antenna, the circuit device comprising:
    a first impedance matching circuit including an output coupled to a node that is configured to couple to the antenna and including an input, the first impedance matching circuit to provide a transmit path, the first impedance matching circuit including a first inductor coupled between a power supply terminal and an output of a power amplifier, a second inductor including a first terminal coupled to the output of the power amplifier and including a second terminal, and a capacitor coupled between the second terminal and the node;
    a second impedance matching circuit including an input coupled to the node that is configured to couple to the antenna and including a first output and a second output, the second impedance matching circuit to provide a receive path separate from the transmit path;
    the power amplifier including the output coupled to the input of the first impedance matching circuit;
    a low-noise amplifier including a first input coupled to the first output of the second impedance matching circuit and including a second input coupled to the second output of the second impedance matching circuit; and
    a selectable impedance adjustment circuit coupled to the first input and the second input of the low-noise amplifier between the low-noise amplifier and the second impedance matching circuit and configured to selectively adjust an impedance associated with the low-noise amplifier when the power amplifier is transmitting a signal through the antenna.

2. The circuit device of claim 1, wherein the first and second inductors and the capacitor are selected to provide an impedance value at the output of the power amplifier to match a transmission line impedance between the antenna and the power amplifier sufficiently to achieve a desired output power that is below a power limit associated with the power amplifier.

3. The circuit device of claim 1, wherein the second impedance matching circuit comprises:
    a capacitor coupled between the node and the first input of the low-noise amplifier; and
    an inductor coupled between the node and the second input of the low-noise amplifier.

4. The circuit device of claim 3, wherein the capacitor and the inductor cooperate to convert a single-ended RF signal from the antenna to balanced differential signals at the first and second inputs to the LNA in a receive mode.

5. The circuit device of claim 4, wherein the selectable impedance adjustment circuit is activated during transmission by the power amplifier to place the capacitor and the inductor in parallel between the antenna and an electrical ground by shorting the first and second inputs of the low-noise amplifier to each other and to the electrical ground.

6. The circuit device of claim 5, wherein the capacitor and the inductor are selected to provide a parallel resonant circuit at a transmission frequency associated with the power amplifier to present high impedance to signals transmitted by the power amplifier.

7. The circuit device of claim 1, wherein the selectable impedance adjustment circuit comprises:
    a first transistor including a control input coupled to a controller and including a drain and a source coupled between the first input of the low-noise amplifier and an electrical ground; and
    a second transistor including a control input coupled to the controller and including a drain and a source coupled between the second input of the low-noise amplifier and the electrical ground.

8. The circuit device of claim 7, further comprising a third transistor including a control input responsive to the controller and including a drain and a source coupled between the first and second inputs of the low-noise amplifier.

9. The circuit device of claim 7, wherein the controller comprises a logic circuit coupled to the output of the power amplifier and configured activate the selectable impedance adjustment circuit when an output signal from the power amplifier exceeds a threshold.

10. A method of coupling to an antenna, the method comprising:
    transmitting a signal from a power amplifier to the antenna through a first signal path that includes a first impedance matching circuit coupled between the power amplifier and the antenna; and
    selectively coupling differential inputs of a low-noise amplifier to each other to shunt current between the differential inputs and to a power supply terminal to adjust an impedance of the low-noise amplifier to present high impedance to first and second outputs of a second impedance matching circuit when the power amplifier is transmitting the signal, the differential inputs including a first input and a second input, the second impedance matching circuit having an input coupled to the antenna, the second impedance matching circuit including a capacitor coupled between the first input and the antenna and including an inductor coupled between the second input and the antenna, the second impedance matching circuit configured to couple the differential inputs of the low-noise amplifier to the antenna to receive a signal from the antenna through a second signal path that is separate from the first signal path; and
    wherein selectively coupling the differential inputs includes:
        activating a first transistor to couple the first input to the power supply terminal;
        activating a second transistor to couple the second input to the power supply terminal;

activating a third transistor to couple the first input and the second input to each other to place the capacitor and the inductor in parallel between the antenna and the power supply terminal to present high impedance to signals transmitted by the power amplifier.

11. The method of claim 10, further comprising selectively decoupling the differential inputs of the low-noise amplifier from each other and from the power supply terminal to adjust the impedance of the low-noise amplifier to present low impedance when the antenna is receiving a signal.

12. The method of claim 10, wherein the power supply terminal comprises an electrical ground terminal.

13. The method of claim 10, further comprising protecting the low-noise amplifier against high voltage signals on the differential inputs using a diode circuit comprising:
   a first anti-parallel diode pair coupled between the first input of the differential inputs of the low-noise amplifier and the power supply terminal; and
   a second anti-parallel diode pair coupled between the second input of the differential inputs and the power supply terminal.

14. A circuit device for coupling to an antenna, the circuit device comprising:
   a first impedance matching circuit including an output coupled to a node configured to couple to an antenna and including an input, the first impedance matching circuit configured to provide a transmit path from the input to the node and to produce a desired power at a transmit frequency;
   a second impedance matching circuit including an input coupled to the node and including a first output and a second output, the second impedance matching circuit configured to provide a receive path from the node to the first output and the second output and to produce balanced differential signals on the first and second outputs from signals received from the node;
   a power amplifier including an output coupled to the input of the first impedance matching circuit;
   a low-noise amplifier including first and second inputs coupled to the first and second outputs of the second impedance matching circuit to receive the balanced differential signals; and
   an impedance adjustment circuit coupled between the second impedance matching circuit and the first and second inputs of the low-noise amplifier and configured to selectively adjust an impedance associated with the low-noise amplifier in response to a control signal; and
   an over-voltage protection circuit comprising:
      a first anti-parallel diode pair including a first diode and a second diode, each having an anode coupled to the first input and a cathode coupled to a power supply; and
      a second anti-parallel diode pair including a third diode and a fourth diode, each having an anode coupled to a second input and a cathode coupled to the power supply;
   wherein the transmit path is separate from the receive path.

15. The circuit device of claim 14, further comprising a controller coupled to the impedance adjustment circuit and configured to produce the control signal to selectively activate the impedance adjustment circuit during a transmit mode of operation.

16. The circuit device of claim 15, wherein the controller comprises a logic circuit coupled to the output of the power amplifier and configured to activate the impedance adjustment circuit when a voltage level at the output of the power amplifier exceeds a threshold representing the transmit mode.

17. The circuit device of claim 15, wherein the controller comprises a processor.

18. The circuit device of claim 15, wherein the selectable impedance adjustment circuit comprises:
   a first transistor comprising:
      a control input responsive to the controller;
      a drain coupled to the first input; and
      a source coupled to a power supply;
   a second transistor comprising:
      a control input responsive to the controller;
      a drain coupled to the second input; and
      a source coupled to the power supply.

19. The circuit device of claim 18, further comprising a third transistor comprising:
   a control input responsive to the controller;
   a drain coupled to the first input; and
   a source coupled to the second input.

\* \* \* \* \*